(12) United States Patent
Goodwin et al.

(10) Patent No.: US 6,435,799 B2
(45) Date of Patent: Aug. 20, 2002

(54) WAFER TRANSFER ARM STOP

(75) Inventors: Dennis L. Goodwin, Chandler; Eric R. Wood, Mesa; Ivo Raaijmakers, Phoenix, all of AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 09/727,635

(22) Filed: Dec. 1, 2000

Related U.S. Application Data

(60) Division of application No. 09/006,325, filed on Jan. 14, 1998, now Pat. No. 6,183,183, which is a continuation-in-part of application No. 08/784,711, filed on Jan. 16, 1997, now abandoned.

(51) Int. Cl.⁷ ................................................. B65H 5/08
(52) U.S. Cl. .................. 414/225.01; 414/217; 414/160; 414/941; 414/752.1; 294/64.3
(58) Field of Search ................................ 414/217, 935, 414/937, 939, 941, 416.01, 27, 222.01, 226.05, 749.2, 749.1, 150, 752.1, 160, 225.01, 151.1; 294/64.1, 64.2, 64.3, 1.1; 118/719; 269/21, 35

(56) References Cited

U.S. PATENT DOCUMENTS

| | | | |
|---|---|---|---|
| 3,431,009 A | * | 3/1969 | Mammel .................... 294/64.3 |
| 3,523,706 A | * | 8/1970 | Logue ......................... 294/64.3 |
| 3,539,216 A | * | 11/1970 | Forcier ....................... 294/64.3 |
| 3,731,823 A | | 5/1973 | Goth |
| 4,009,785 A | * | 3/1977 | Trayes ..................... 414/941 X |
| 4,029,351 A | * | 6/1977 | Apgar et al. ................ 294/64.3 |
| 4,208,159 A | | 6/1980 | Uehara et al. |
| 4,318,767 A | | 3/1982 | Hijikata et al. |
| 4,534,695 A | | 8/1985 | Stump et al. |
| 4,566,726 A | | 1/1986 | Correnti et al. |
| 4,586,743 A | * | 5/1986 | Edwards et al. ............ 294/86.4 |
| 4,775,281 A | | 10/1988 | Prentakis |
| 4,951,601 A | | 8/1990 | Maydan et al. |
| 4,985,722 A | | 1/1991 | Ushijima et al. |
| 5,022,695 A | * | 6/1991 | Ayers ................ 414/416.03 X |
| 5,080,549 A | | 1/1992 | Goodwin et al. |
| 5,135,349 A | | 8/1992 | Lorenz et al. |
| 5,176,493 A | | 1/1993 | Toro-Lira et al. |
| 5,297,910 A | | 3/1994 | Yoshioka et al. |
| 5,324,155 A | * | 6/1994 | Goodwin et al. ...... 294/64.3 X |
| 5,445,491 A | | 8/1995 | Nakagawa et al. |

* cited by examiner

*Primary Examiner*—Frank E. Werner
(74) *Attorney, Agent, or Firm*—Knobbe, Martens, Olson & Bear, LLP

(57) ABSTRACT

A dual-arm wafer hand-off assembly includes a pair of pickup arms for transferring wafers within a wafer processing system. The two pickup arms are adapted to move such that the wafer on one of the arms can be positioned over the other arm and handed off. In one version, a Bernoulli-style wand translates along a linear guideway and may be positioned over a paddle-style pickup arm. The wafer carried by the Bernoulli wand can be handed off to the paddle by shutting off the flow of gas from the Bernoulli wand jets. The two pickup arms may be mounted on linear slides and adapted to translate between a load/unload chamber and a processing chamber, or the guideway may be adapted to rotate to allow transfer of wafers to multiple processing chambers in a cluster system. One of the pickup arms is preferably an all-quartz Bernoulli-style pickup arm having a proximal arm portion and a distal wand. The arm portion is formed by a pair of juxtaposed plates with a gas passage therethrough, and the distal wand is also formed by a pair of juxtaposed plates with a plurality of gas passages therethrough. The arm portion and the wand are fused together at their junction region. A wafer stop element is formed by a single quartz rod and is clipped to the arm portion to present a plurality of wafer stop pegs at a proximal periphery of the wand. The wafer stop element may be rapidly installed or removed without fasteners or bonding.

15 Claims, 12 Drawing Sheets

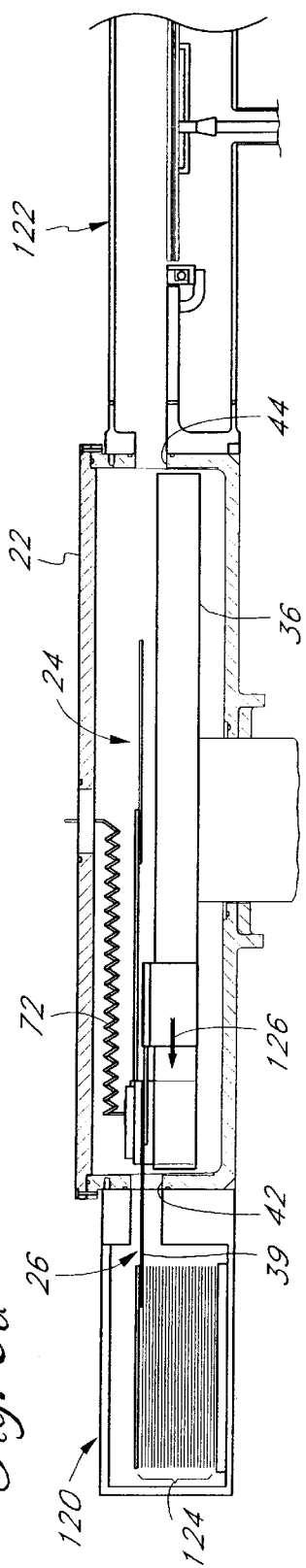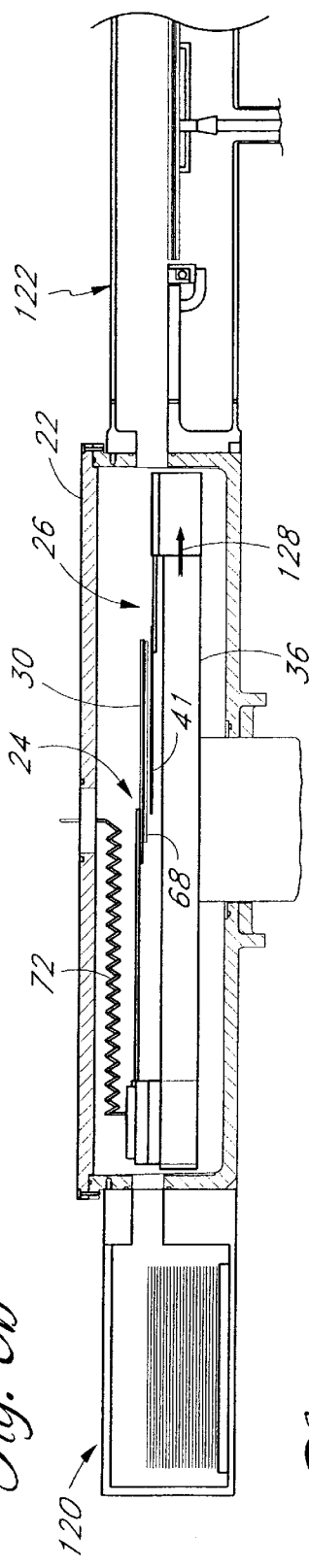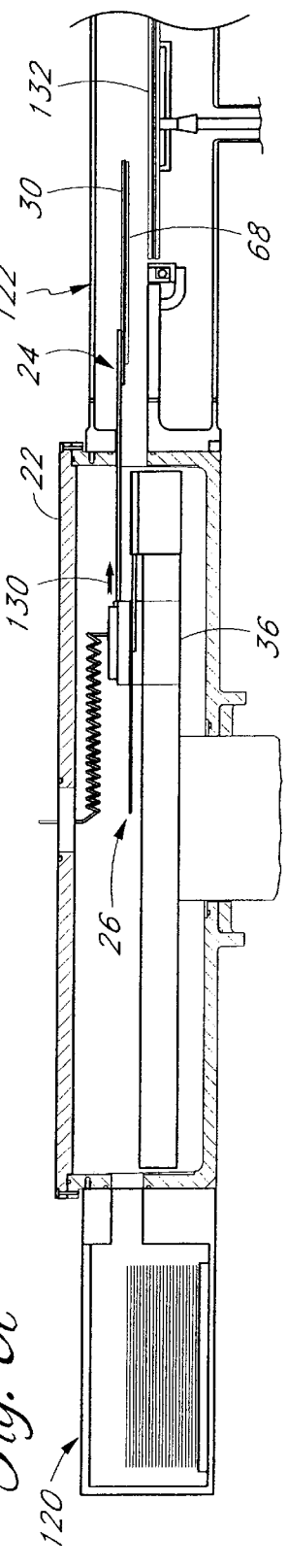

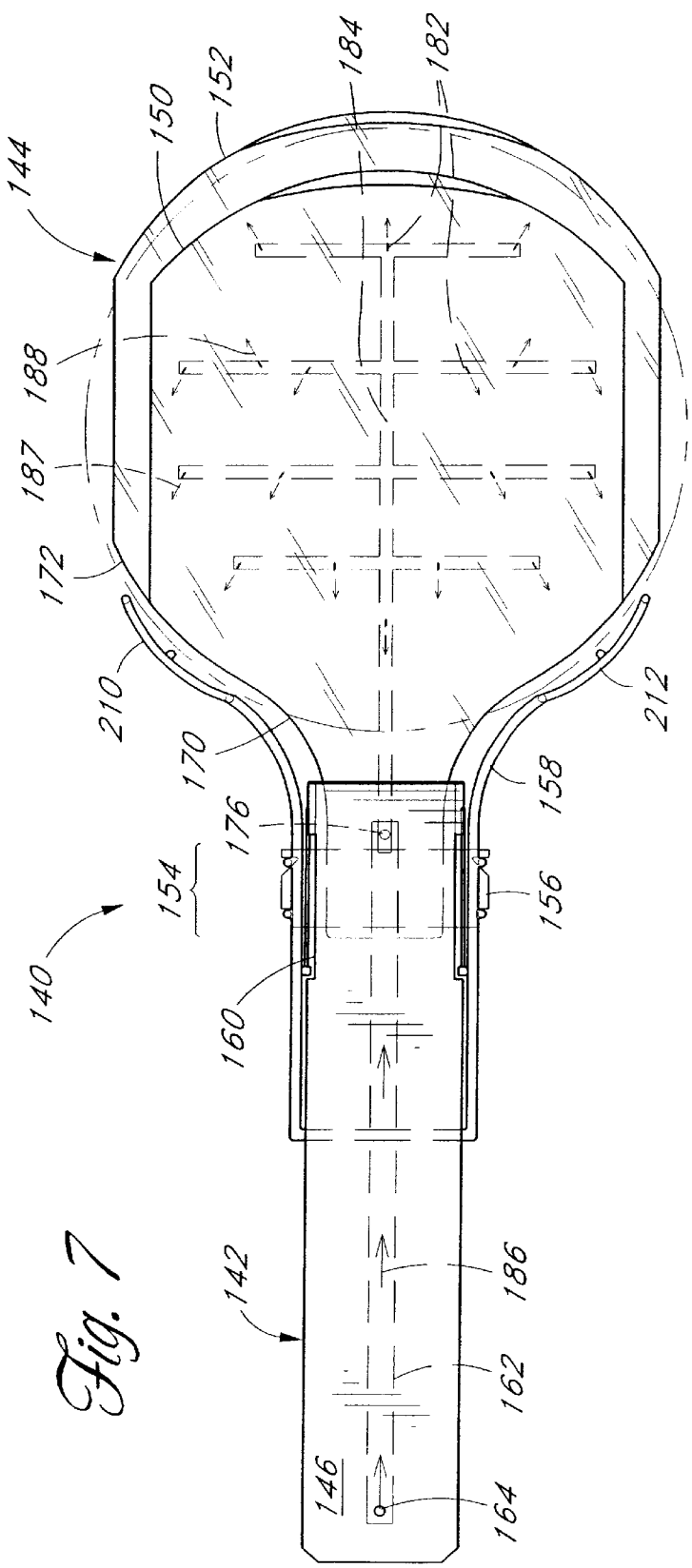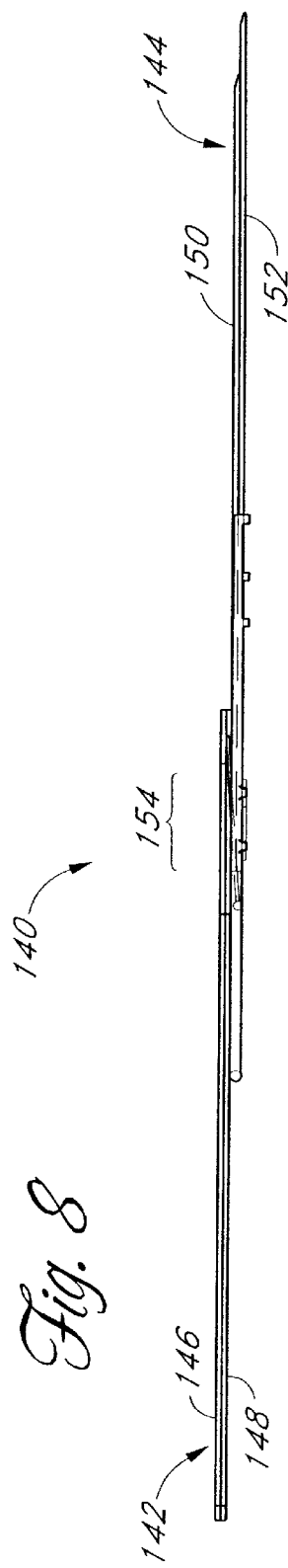

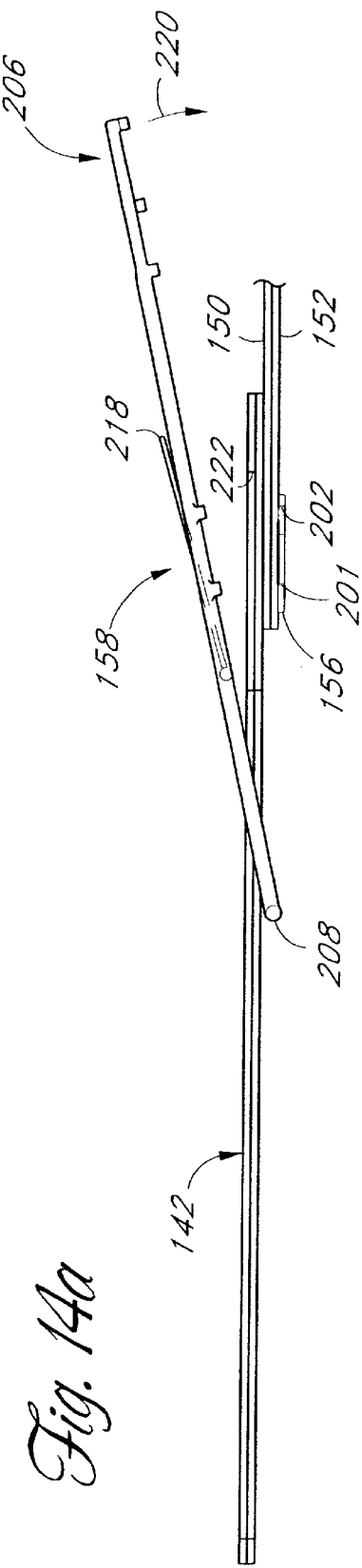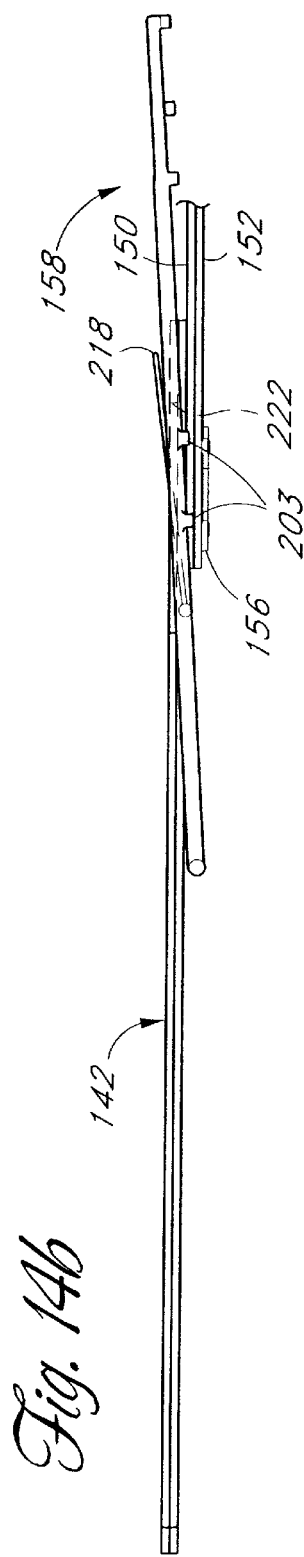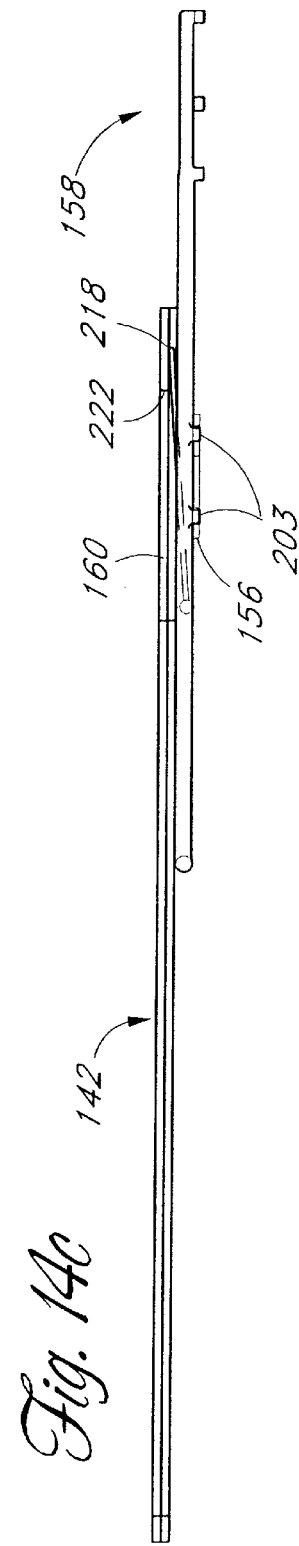

WAFER TRANSFER ARM STOP

RELATED APPLICATION

This is a divisional of U.S. patent application Ser. No. 09/006,325 filed Jan. 14, 1998, now U.S. Pat. No. 6,183,183 which is a continuation-in-part of U.S. patent application Ser. No. 08/784,711 filed Jan. 16, 1997, now abandoned.

FIELD OF THE INVENTION

The present invention relates to a system and method of handling semiconductor wafers and, more particularly, to an apparatus having both a Bernoulli-type pickup wand and a paddle-type pickup and being capable of transferring wafers therebetween.

BACKGROUND OF THE INVENTION

In the processing of semiconductor devices, such as transistors, diodes, and integrated circuits, a plurality of such devices are fabricated simultaneously on a thin slice of semiconductor material, termed a substrate or wafer. Such wafers are extremely brittle and easily contaminated. During manufacturing of semiconductor integrated circuits, therefore, care must be taken to avoid physical damage and particulate contamination to the wafers.

Various systems are known for handling wafers within semiconductor processing systems. The particular application or environment from which the wafer is lifted often determines the type of pickup device. One class of pickup devices, known as Bernoulli wands, are typically used for high temperature applications. Bernoulli wands utilize jets of gas downward from the wand toward the wafer to create a region of low pressure above the wafer, therefore lifting it. The advantage being that the hot wafer need not contact the pickup wand, except perhaps at one or more small locators depending underneath the wand. Such a Bernoulli wand is shown in U.S. Pat. No. 5,080,549 to Goodwin, et al.

Another type of wafer pickup wand utilizes a vacuum force and thus must be in intimate contact with the wafer. U.S. Pat. No. 4,566,726 to Corenti, et al., discloses a combination Bernoulli and vacuum-type pickup device.

A third type of wafer pickup device is a simple paddle augmented with a vacuum which supports wafers from underneath. Such a paddle is illustrated in U.S. Pat. No. 4,951,601, to Maydan, et al. This patent also illustrates a typical movement device for translating wafers from location to location within processing systems. The wafer handler is capable of linear retraction and extension, as well as rotation about an axis.

U.S. Pat. No. 5,135,349 to Lorenz, et al., discloses a robotic handling system utilizing two paddle style pickups mounted on a common rotating base. Both pickups are adapted to extend linearly away from one another to speed up handling of wafers within the processing system. Again, the paddles are augmented with a vacuum generated through a plurality of holes in an end effector portion of each paddle; the vacuum being transmitted along a channel within the paddle.

There are two main drawbacks to prior wafer handling systems. A single wafer handler may not be appropriate for picking and placing wafers into or out of particular processing environments. That is, a Bernoulli wand might be suitable for high temperature environments, but has a relatively high profile which may limit its maneuverability between closely spaced wafers. Furthermore, rotating handling robots, such as the ones shown in the patent to Maydan, et al., require a significant amount of horizontal room to maneuver. Although the device in the Maydan patent is a multiple chamber processing system, many systems only include a single processing chamber, and thus such a rotational wafer handler is inefficient.

SUMMARY OF THE INVENTION

Briefly stated, the invention provides a dual-arm wafer handling assembly that includes a pair of pick-up arms for transferring wafers within a wafer processing system. The two pick-up arms are adapted to move such that the wafer moved by one of the arms can be aligned with the other arm to enable the wafer to be transferred between the two. In one version, a paddle-style pick-up arm is utilized to move wafers into and out of a storage cassette or other area which is usually not highly heated, and then transferred to a Bernoulli wand and moved into and out of another location such as a high temperature process chamber. The two arms preferably move in linear paths with the paddle and a head of the Bernoulli wand being in overlapping position so that a wafer carried by the retracted paddle is moved directly beneath the head of a retracted Bernoulli wand. Gas emanating from the Bernoulli wand is directed onto the wafer and then deflected outwardly to the edges of the wafer and the head of the Bernoulli wand creating a low pressure above the wafer which lifts it from the paddle and allows it to be moved by the Bernoulli wand without having the wafer contacting the Bernoulli wand, except at locator points on the edge of the wafer. In the reverse procedure, a wafer may be transferred from a wand to a paddle.

Advantageously, the Bernoulli wand portions that extend into the process chamber can withstand the high temperatures in the chamber, thus, allowing a wafer to be retracted at a temperature higher than that which can be withstood by the normal paddle materials. Further, even if the paddle is made of material which can withstand high temperatures, it is undesirable to touch the wafer at such elevated temperatures. The paddle, on the other hand can move into and out of standard wafer carriers whereas a Bernoulli wand may be too thick for some.

In one form of the invention, the mechanism for moving the two pick-up arms is controllable to move the arms at varied accelerations and velocities during a process cycle. Thus, in accordance with a method of the invention, the maximum parameters for the pick-up arms with and without a wafer, can be selected.

In another aspect of the invention, the quartz Bernoulli wand head has a unique wafer stop for limiting rearward movement of a wafer. The stop is separately removable from the remainder of the head which enables the stop to be replaced separately as needed.

BRIEF DESCRIPTION OF THE DRAWINGS

FIG. 6a is a cross-sectional view of a wafer handling chamber located between a load lock chamber and a processing chamber, with the wafer transfer assembly in a position placing a wafer in or retracting a wafer from the load lock chamber;

FIG. 6b is a cross-sectional view of the handling chamber with the wafer transfer assembly in a wafer handoff position;

FIG. 6c is a cross-sectional view of the handling chamber of the wafer transfer assembly in a position placing a wafer in or retracting a wafer from a processing chamber.

FIG. 7 is top-elevational view of a preferred all quartz Bernoulli wand of the present invention;

FIG. 8 is a side-elevational view of the Bernoulli wand;

FIG. 14a is a side elevational view of the quartz wafer stop element prior to assembly on an arm portion of the Bernoulli wand;

FIG. 14b is a side elevational view of the quartz wafer stop element in an intermediate assembly position; and FIG. 14c is a side elevational view of the quartz wafer stop element assembled to the arm portion of the Bernoulli wand.

DESCRIPTION OF THE PREFERRED EMBODIMENTS

Figure 1:
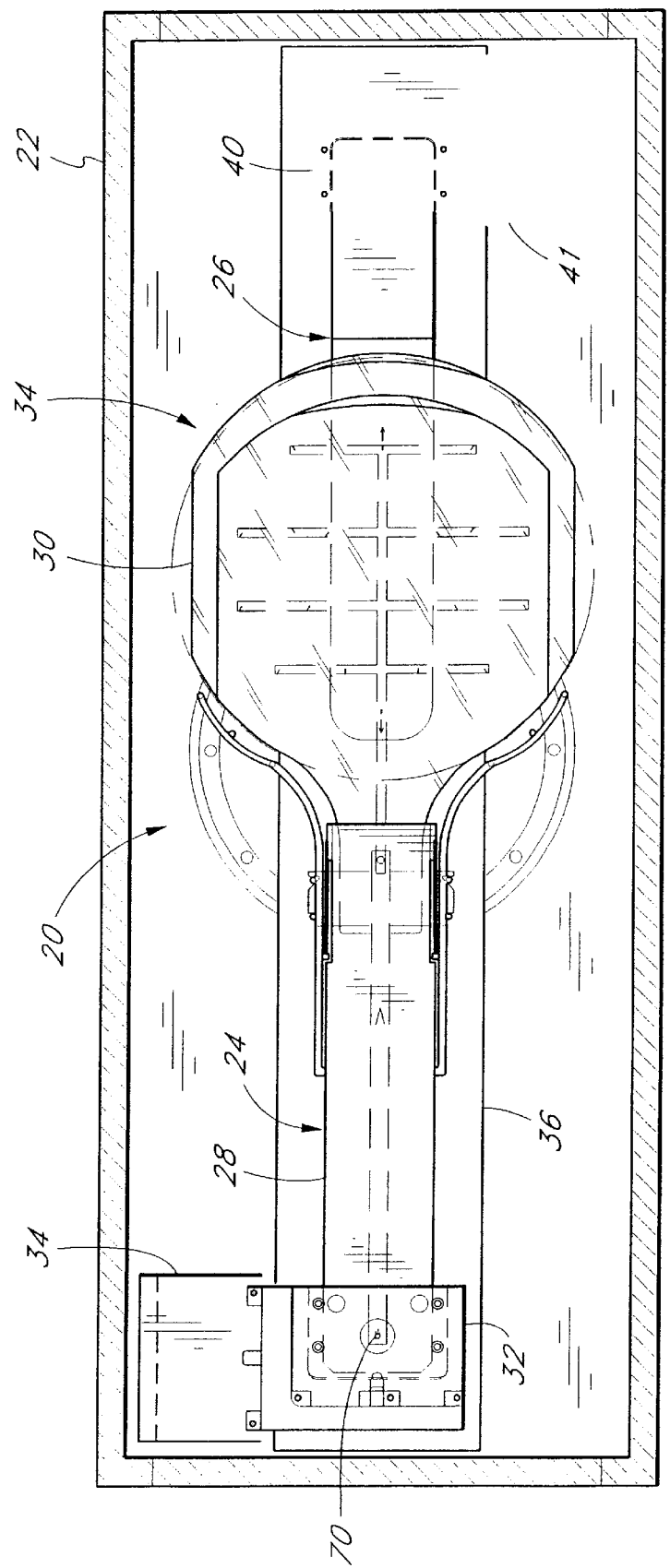
FIG. 1 is a top view of a wafer transfer assembly of the present invention.
Figure 2:
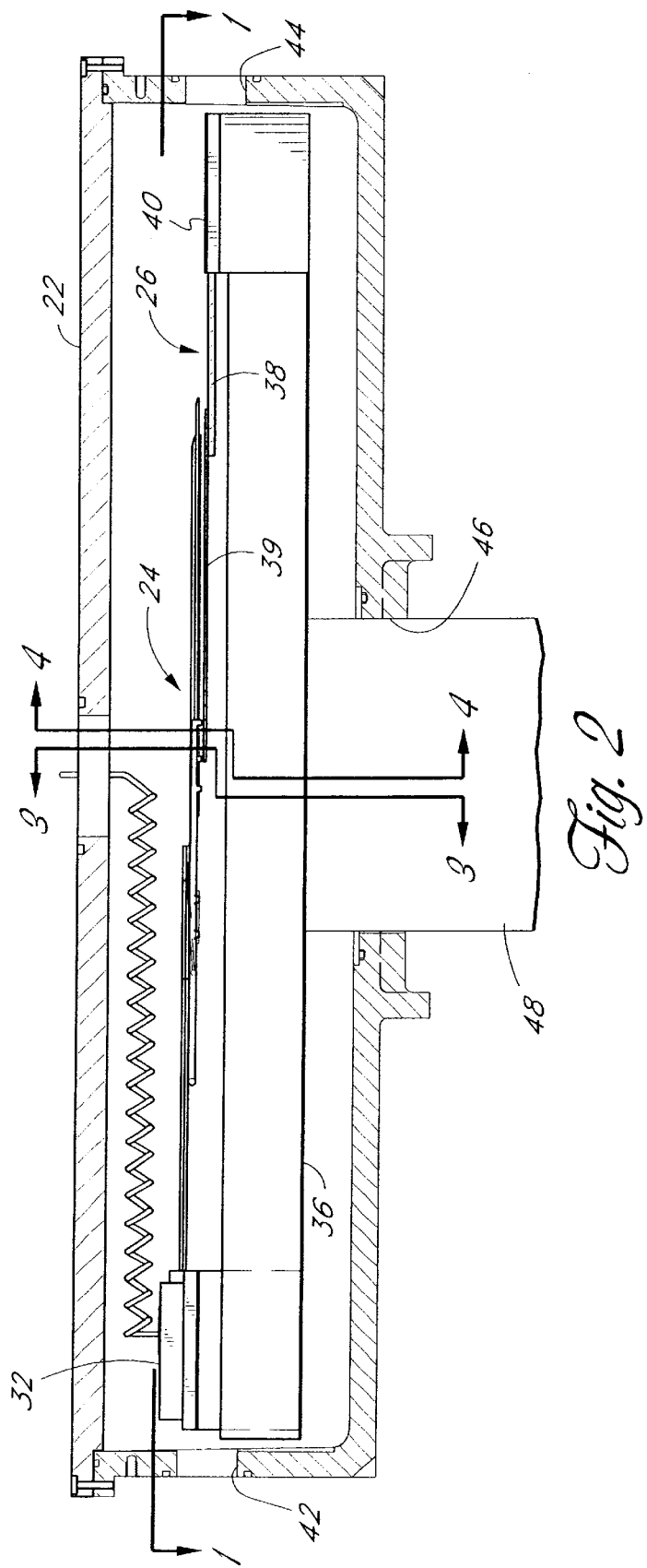
FIG. 2 is a side elevational view of the wafer transfer assembly.

FIGS. 1 and 2 illustrate a dual-arm wafer hand-off assembly 20 of the present invention mounted within a handling chamber 22. As will be explained in more detail below, the handling chamber 22 forms a portion of a wafer processing system and is located between a wafer load/unload chamber and a wafer processing chamber. Although the present invention is particularly suited for transferring wafers to and from the load/unload chamber and processing chamber, it may be positioned in other locations within CVD processing system where the advantageous attributes disclosed herein would be useful.

The wafer hand-off assembly 20 includes two wafer pickup arms 24 and 26 mounted to translate along intersecting paths between the load/unload chamber and processing chamber. The term intersecting paths is used to describe paths of motion which bring the two pickup arms 24 and 26 into relative positions allowing for wafers to be transferred, or "handed off," therebetween. In the present embodiment, upper and lower pickup arms 24 and 26, respectively, translate along parallel and vertically spaced linear axes to allow for pickup arm overlap, although the invention should not be limited thereby. For example, the two pickup arms 24 and 26 might be configured to rotate in intersecting paths about a common axis, or they might traverse tangential circular arcs or other paths which allow the pickup arms to overlap, or otherwise be in relative positions to transfer wafers.

The pickup arm 24 comprises a proximal arm portion 28 attached to a distal pickup head 30. The pickup head 30 is preferably a Bernoulli-type wand which lifts wafers using jets of gas downward toward the upper surface of the wafer to create a reduced pressure region above the wafer. As such, the pickup head 30 will be termed a Bernoulli wand from here on. A proximal end of the arm portion 28 is fastened within a manifold bracket 32. The manifold bracket 32, in turn, is mounted to a linearly movable carriage 34 adapted to translate along a guideway 36 generally centrally located in a longitudinal direction within the handling chamber 22. The movement of the pickup arm 24 will be described below in more detail with respect to FIGS. 3–5. The proximal and distal directions are used herein with respect to each arm 24 or 26 to denote the end mounted on the respective linear carriages (proximal) and the opposite end cantilevered therefrom (distal).

The pickup arm 26 comprises a proximal arm portion 38 terminating in a distal paddle 39, which in FIGS. 1 and 2 is beneath the Bernoulli wand 30. The arm portion 38 mounts to a bracket 40 attached to a linearly movable carriage 41 also adapted to longitudinally translate along the guideway, although on an opposite lateral edge from the carriage 34. The paddle 39 may be of a variety of constructions and is adapted to physically lift a wafer from underneath by direct contact therewith. The paddle 40 has a relatively low profile and is substantially narrower than either the wafer being lifted or the Bernoulli wand 30.

Figure 3:
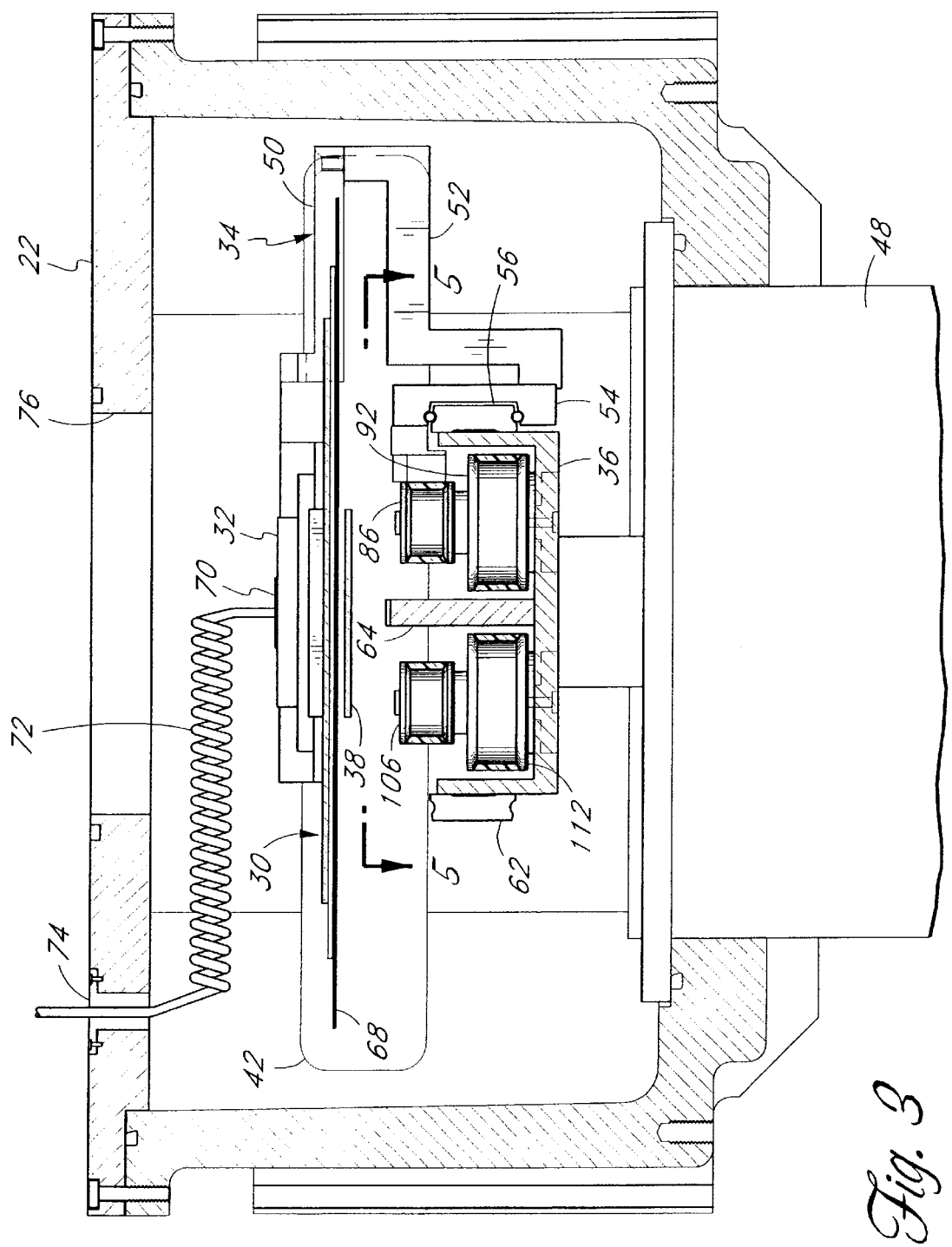
FIG. 3 is a vertical cross-sectional view through the wafer transfer assembly taken along line 3—3 of FIG. 2.
Figure 4:
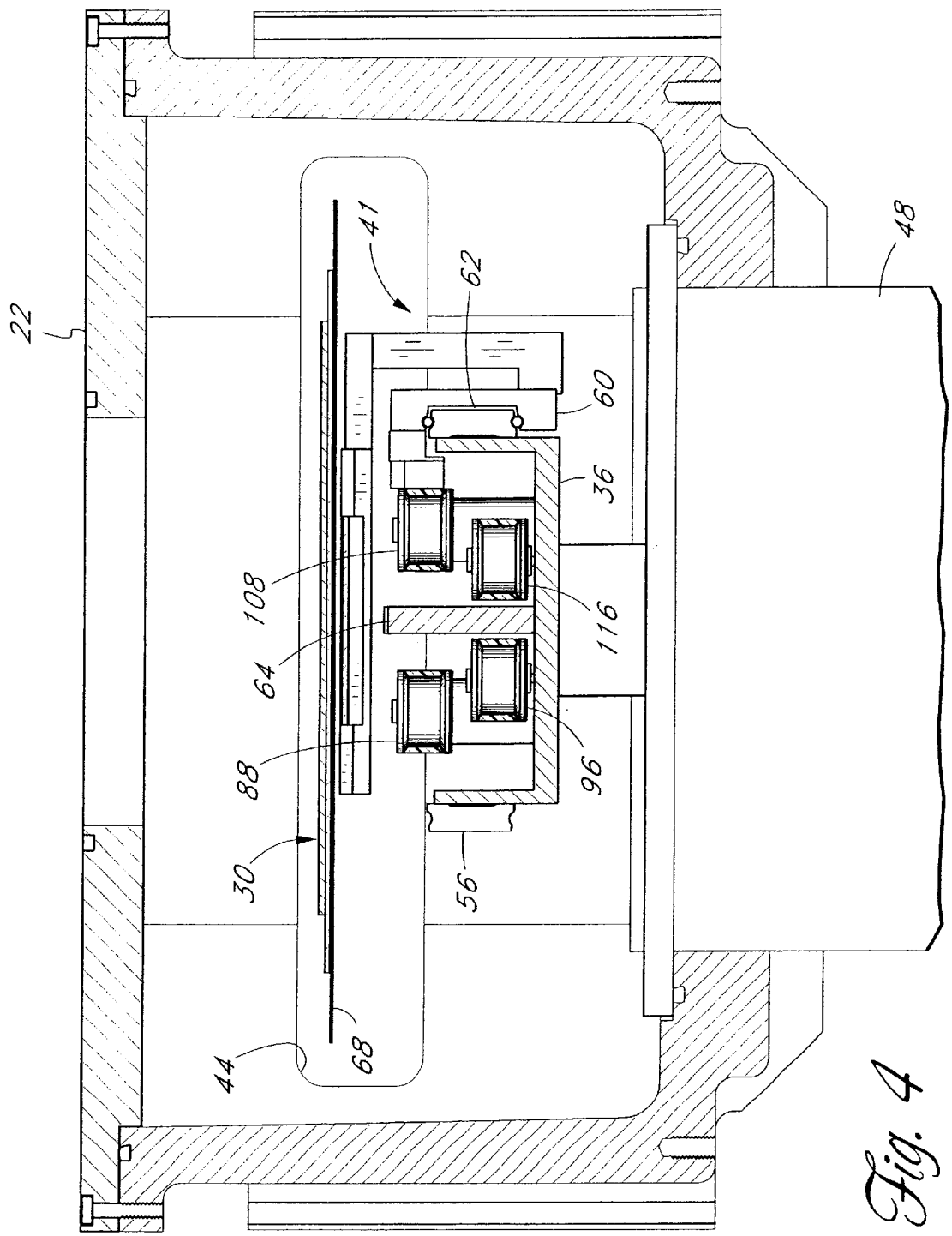
FIG. 4 is a vertical cross-section of the wafer transfer assembly taken along line 4—4 of FIG. 2, and looking in the opposite direction from that of FIG. 3.

FIG. 2 illustrates the handling chamber 22 in cross-section, and shows a load/unload chamber port 42 on one end, and a processing chamber port 44 on an opposite end. The ports 42 and 44 are each aligned with one of the pickup arms 24 and 26, and are sufficiently wide, as seen in FIGS. 3 and 4, to allow transport of wafers therethrough. The handling chamber 22 also includes a lower circular aperture 46 closed by a resilient bush diaphragm 48, whose purpose is well-known by those with skill in the art.

With reference to FIG. 3, the carriage 34 is seen in elevation and includes a horizontal portion 50 attached to the manifold bracket 32 and a stepped portion 52 extending downward and inward to translate along the guideway 36. In this respect, the angled portion 52 attaches to a linear bearing 54 mounted to translate along a horizontal rail 56 rigidly mounted one lateral edge of the guideway 36.

Figure 5:
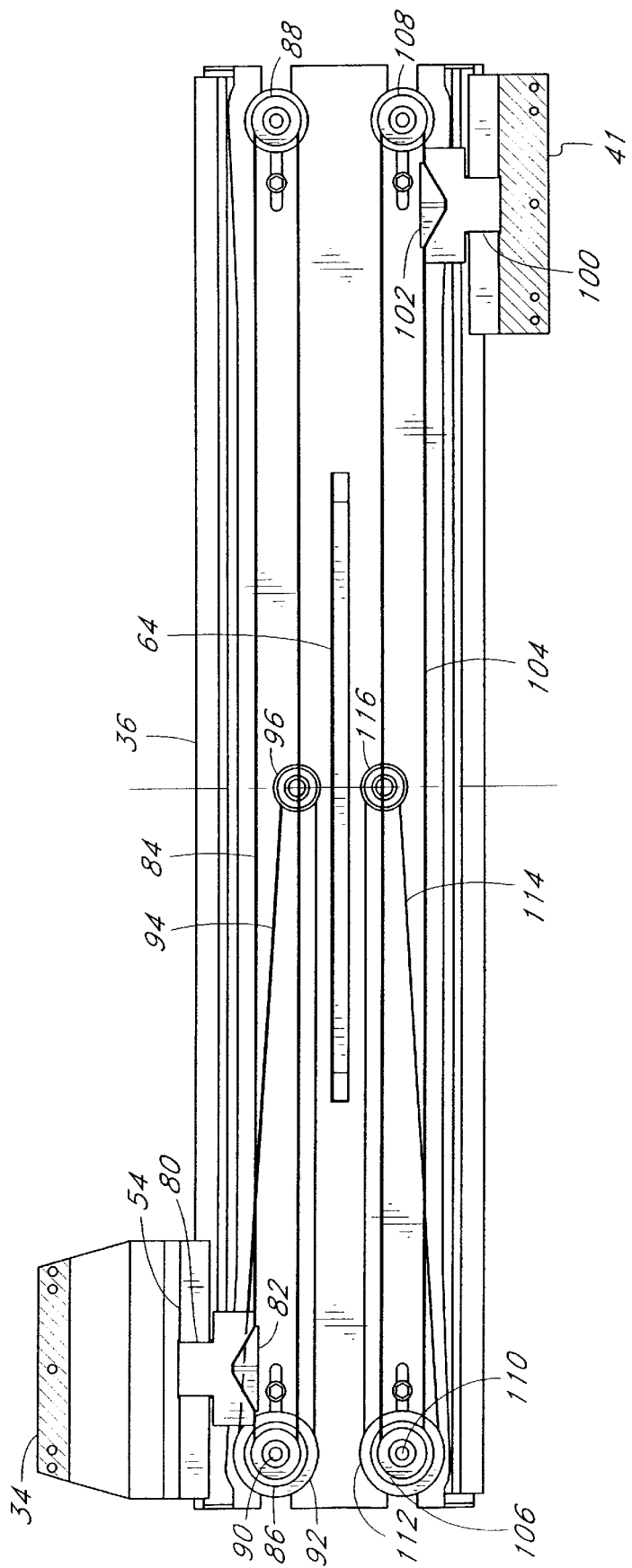
FIG. 5 is a top-elevational view of a dual carriage linear movement mechanism taken on line 5—5 of FIG. 3.

FIG. 4 is a vertical cross-section through the handling chamber 22 looking in the opposite direction from that of FIG. 3, and illustrates the carriage 41 mounted to a linear bearing 60 adapted to slide on a horizontal rail 62. The horizontal rail 62 forms a portion of the guideway 36 and is mounted on an opposite lateral edge from the horizontal rail 56. In this respect, the guideway 36 has a generally sideways E-shaped cross-section with the legs of the E extending vertically upward; the rails 56 and 62 being mounted on exterior surfaces of the upper and lower legs of the E. A central leg 64 of the guideway 36 is positioned between the rails 56 and 62, but only extends approximately half the length of the guideway, as seen in FIG. 5.

FIGS. 3 and 4 illustrate a wafer 68 held underneath the Bernoulli wand 30 of the upper pickup arm 24 with the paddle 39 directly underneath the centerline of the wafer 68. If the upper pickup arm 24 is in operation, the wafer 68 is being held by a non-contact levitation force, and gas flow to the Bernoulli wand 30 need only be shut off for transferring wafer 68 to the paddle 39.

The manifold bracket 32 includes a central gas inlet 70 (FIG. 1) receiving a coiled extension hose 72 for supplying gas to the pickup arm 24. The internal gas passages of the first pickup arm 24 and Bernoulli wand 30 will be described below in more detail. The extension hose 72 exits the handling chamber 22 at a sealed sleeve 74. The handling chamber 22 further includes an upper viewing port 76 which is typically closed by a plate of transparent material, such as quartz. The remainder of the handling chamber 22 is preferably machined from stainless steel, or other such non-corrosive material to reduce the amount of particulates within the handling chamber.

As mentioned, the upper and lower pickup arms 24 and 26 translate linearly along the guideway 36. In this respect, the carriages 34 and 41 are driven by a belt and pulley arrangement seen in FIG. 5. This type of drive for two adjacent carriages is known in the art, and one such drive is sold by Cybeq Systems, Inc., of Menlo Park, Calif., under the name 6000 Vacuum Robot. The details of the drive mechanism are schematically shown and described herein, and reference may also be made to U.S. Pat. No. 5,135,349, to Lorenz, et al., expressly incorporated by reference herein.

FIG. 5 shows the carriage 34 having a belt clamp 80 mounted to the linear bearing 54. This clamp includes a shallow V-shaped notch and a clamping member 82 fastened therein with suitable means. A carriage belt 84 is clamped within the V-shaped depression by the member 82. The carriage belt 84 loops around a driven pulley 86 on one end of the guideway 36, and around an idle pulley 88 on the opposite end. The driven pulley 86 is mounted to rotate on a shaft 90 which rotates with a larger speed reduction pulley 92 also mounted thereon. A drive belt 94 loops around the speed reduction pulley 92, and also around a smaller drive pulley 96 disposed at the center of the guideway 36.

In like manner, the carriage 41 includes a belt clamp 100 having a shallow V-shaped notch and a clamping member 102. A carriage belt 104 is held by the belt clamp 100 and loops around a driven pulley 106 and an idle pulley 108 disposed on opposite ends of the guideway 36. The driven pulley 106 is mounted to rotate about a shaft 110 on which a larger speed reduction pulley 112 is also mounted. A drive belt 114 extends around the speed reduction pulley 112 and around a smaller drive pulley 116. The different sizes of the pulleys around which the drive belt 114 and carriage belt 104 extend provide for speed reduction of the rotational speed of the shaft of the drive pulley 116, to reduce the linear speed of the carriages.

The drive pulleys 96 and 116 define outputs of small motors within a cylindrical housing forming a part of the Cybeq wafer handling system (not shown). The motors and hence the pulleys 96 and 116 can provide the acceleration and velocity desired. Further, these parameters can be optimized for each pick-up arm during a cycle. The cylinder may be raised or lowered to adjust the elevation of the guideway 36, or may rotate the entire guideway 36 including the pickup arms 24 and 26. Such rotation is useful when the present invention is positioned within a multiple chamber or cluster system, although this will increase the space requirements of the wafer hand-off system. Of course, as will be appreciated by one of skill in the art, the rotating feature of the entire guideway 36 is not needed for the presently illustrated linear transfer embodiment, which results in a minimization of space needs.

FIGS. 6a, 6b and 6c illustrate a typical sequence of movement of the pickup arms 24 and 26 of the wafer hand-off assembly 20. As mentioned above, the handling chamber 22 is attached to a load/unload chamber 120 on one end, and a processing chamber 122 on an opposite end. The ports 42 and 44 on opposite ends of the handling chamber 22 are aligned with similarly sized ports in the load/unload and processing chambers 120 and 122, respectively. A cartridge or magazine 124 of multiple wafers is positioned within the load/unload chamber 120, and may be adjustable in a vertical direction to align a particular wafer with the port 42. A controlling computer provides instructions to the motors driving the pulleys 96 and 116 to cause the pickup arms 24 and 26 to translate along the guideway 36.

In a first motion, as seen in FIG. 6a, the pickup arm 26 translates toward the chamber 120 in a left direction as indicated by the arrow 126. The paddle 39 extends through the port 42 and underneath a wafer in the cartridge 124. As mentioned, the cartridge 124 may be vertically movable or the paddle 39 may be independently vertically movable to extend underneath the wafer without contact therewith, and then undergo relative vertical motion to lift the wafer from the cartridge.

In FIG. 6b, the arrow 128 indicates the movement of the pickup arm 26 into its "home" position which places the wafer 68 directly underneath the Bernoulli wand 30. Gas flow to the Bernoulli wand is then initiated through the extension hose 72 to enable transfer of the wafer 68 from the paddle 39 to the Bernoulli wand 30.

After the wafer 68 has been lifted by the Bernoulli wand 30, the pickup arm 24 translates toward the chamber 122 to the right, as indicated by the arrow 130 in FIG. 6c, to insert the Bernoulli wand 30 and wafer 68 into the processing chamber 122. In the illustrated embodiment, the processing chamber 122 is suitable for chemical vapor deposition (CVD) and includes a rotatable susceptor 132 upon which the wafer 68 is placed. By stopping the flow of gas through the extension hose 72, and Bernoulli wand 30, the wafer 68 is dropped on the susceptor 132. Typically, a gate valve is positioned between the handling chamber 22 and the processing chamber 122, although this gate valve is not illustrated for clarity.

The pick-up arm 24 is then retracted to the position of FIG. 6A. If the system employs a single chamber 122, the pick-up arm 24 will be idle until the wafer 68 has been processed within the chamber 122. It then is moved to the right again, as indicated in FIG. 6 to pick up the hot wafer and withdraw it into the handling chamber, as in FIG. 6b. The wafer is then transferred to the paddle pick-up arm 26 and returned to the load/unload chamber 120. The paddle is then moved to pick up another wafer to be processed and the cycle is repeated.

It should be noted that the processed wafer 68 may be removed from the chamber 122 while the wafer is quite hot because the portion of the Bernoulli wand that enter the process chamber are made of quartz or other material which can withstand high temperatures. Also, the paddle of the pick-up arm 26 is sufficiently thin that it can enter standard size cassettes to pick up and return wafers. Further, the inline linear arrangement is faster than using a single pick-up arm wherein it would be necessary to rotate the arm in order to perform the complete operation of picking up a wafer from a storage area, transfer it to the process chamber, and return it to the storage area.

On the other hand, if the wafer handling system is used with multiple chambers so that it can be rotated to the degree necessary, the advantages of the system are increased. For example, when a wafer is being processed, the pick-up arm 24 may be retracted to receive a second wafer which is waiting on the pick-up arm 26 and transfer it to a second chamber. Or, depending upon the process times involved, a processed wafer may be removed from one chamber and returned to a storage or staging area; followed by an additional wafer being removed from storage and placed in the second chamber while a wafer in the other chamber is being processed. Various permutations of this arrangement may be utilized to minimize the wafer handling time and to maximize the time that the process chambers are being utilized.

A further advantage of the system is obtained by maximizing the acceleration and velocity of the pick-up arms when they are moving with or without a wafer. That is, the acceleration and speed of moving a pick-up arm is limited by those rates at which a wafer can be safely handled. However, this limitation is not a factor when the arm is moved without a wafer.

As an example, the following parameters have been determined for an experimental system processing 200 millimeter wafers. While carrying a wafer, the paddle-type pick-up arm 26 could be safely accelerated at a maximum rate of about 27 inches per second per second to obtain a maximum velocity of about 14 inches per second. This computes to an extend or retract time of less than 2 seconds. By contrast without a wafer, the arm may be accelerated at a maximum rate of about 84 inches per second per second to attain a maximum velocity of about 18 inches per second and an extend or retract time of about 1 and ⅓ seconds. The Bernoulli wand pick-up arm 24, while carrying a wafer, can be safely moved at a maximum acceleration of about 21 inches per second per second to attain a velocity of about 10 inches per second and an extend or retract time of about 2½ seconds. Without carrying a wafer, the Bernoulli pick-up arm can be moved at the same acceleration and speed of the paddle-type pick-up arm 26.

Thus, it can be seen that the output of a system can be increased utilizing this multiple speed arrangement. The arrangement is most efficient when multiple chambers are employed, since there is less time in which the wafer handler system is idle while waiting for a process to be completed. Thus, the actual output increases will be a function of the number of chambers and the duration of the various processes being employed.

All-Quartz Pickup Arm

FIGS. 7–14 illustrate a preferred embodiment of a pickup arm 140, made of quartz or other material, suitable for use in picking up hot wafers from environments such as the high temperature processing chamber 122 illustrated in FIGS. 6a–c. It will be understood that although the pickup arm 140 is especially suited for use in the dual-arm, wafer hand-off assembly 20 illustrated and described above, it may also be incorporated into other systems, such as single arm wafer transfer systems.

The pickup arm 140 comprises a proximal arm portion 142, and a distal pickup head or wand 144. The Bernoulli-style wand 144 lifts a wafer using jets of gas directed downward to create a low pressure region above the wafer. The arm portion 142 includes a top arm plate 146 and a bottom arm plate 148 rigidly fixed together. The Bernoulli wand 144 includes juxtaposed upper and a lower plates 150, 152 firmly joined together. The distal end of the arm portion 142 is rigidly fastened to the proximal end of the Bernoulli wand 144 in a junction region 154. The remaining components of the pickup arm 140 include a quartz lower support plate 156, and a quartz wafer stop element 158.

Figure 9:
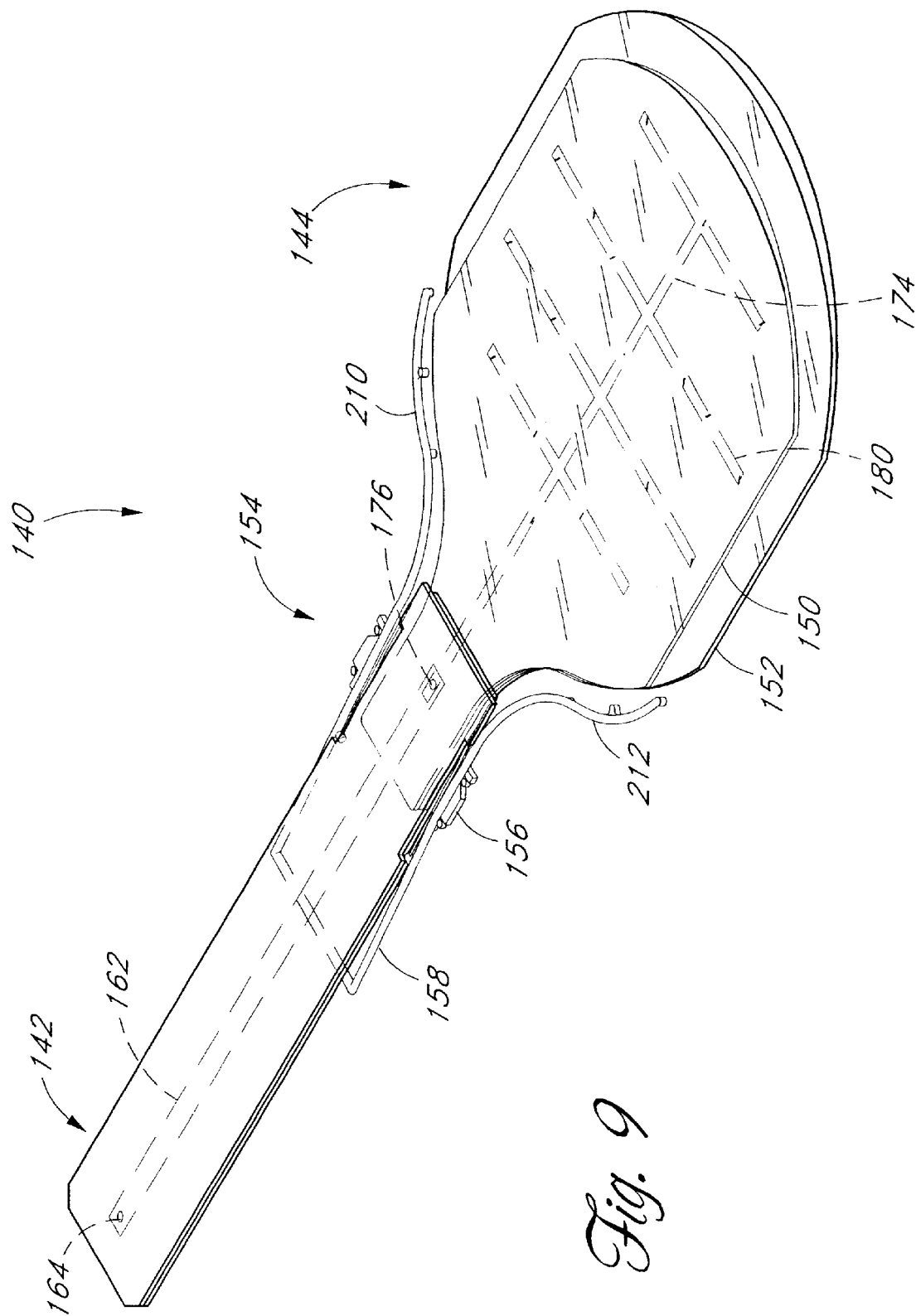
FIG. 9 is a perspective view of the Bernoulli wand.
Figure 10:
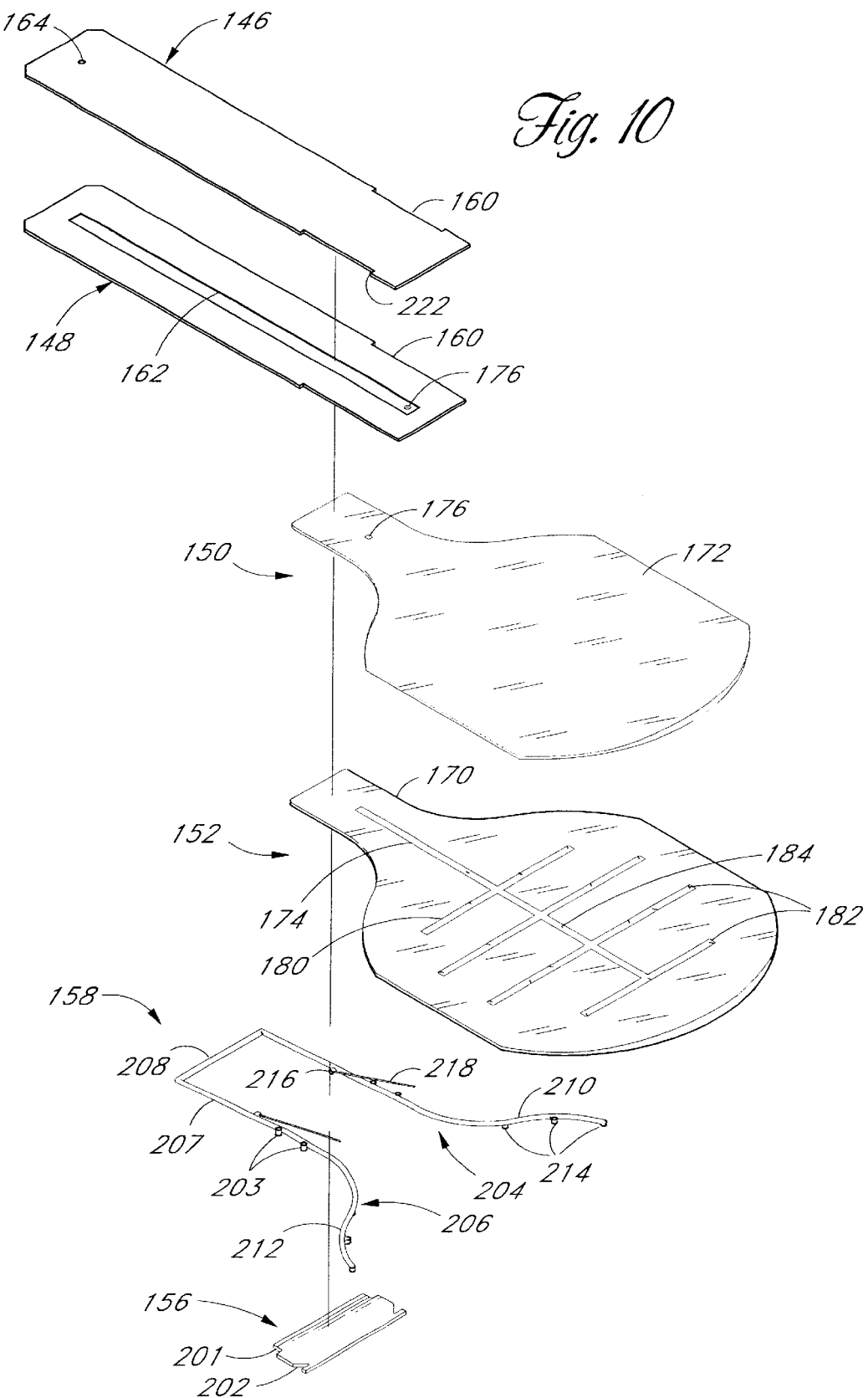
FIG. 10 is a perspective exploded view of the Bernoulli wand.

As best seen in FIGS. 9 and 10, the top and bottom arm plates 146 and 148 have a generally elongated rectangular shape. Each has opposed rectangular cut-out regions 160 along its long sides (the regions 160 on the lower plate 148 extending to the distal end thereof). An elongated arm gas passage 162 is defined between the two plates 146 and 148, and preferably comprises a shallow groove ground in one or the other of the plates. A gas inlet conduit 164 is formed through the top arm plate 146 and communicates with the passage 162. The inlet conduit 164 receives gas via the manifold bracket 32, which in turn is supplied with gas through the extension hose 72. The manifold bracket 32 typically comprises a pair of metal plates having a plurality of fasteners for tightening the plates around the proximal end of the quartz arm portion 142. O-rings or other such seals may be provided surrounding the quartz arm portion 142, or surrounding the gas inlet conduit 164.

The wand 144 defined by the upper and lower plates 150 and 152 has a generally racket shape with a neck portion 170, and a head portion 172 (FIG. 7). Both the upper and lower wand plates 150 and 152 extend the full length of the neck portion 170, while the head portion 172 of upper wand plate 150 is smaller in size than the lower wand plate 152, as best seen in FIG. 7. A wand gas channel 174 is formed between the upper and lower wand plates 150 and 152, and is preferably formed by a channel ground into one or the other of the plates. In the illustrated embodiment, as seen in FIG. 10, the gas channel 174 is ground into the top surface of the lower wand plate 152. The wand gas channel 174 extends longitudinally along the head portion 172 and neck portion 170, and communicates with the arm gas passage 162 through a transfer conduit 176. In this respect, the neck portion 170 of the wand 144 extends underneath the arm portion 142, and specifically, the neck portion of the upper wand plate 150 is juxtaposed against the lower surface of the bottom arm plate 148. The transfer conduit 176 is thus defined by aligned holes formed through the bottom arm plate 148 and the upper wand plate 150.

A plurality of transverse gas passages 180 intersects the central wand channel 174 to provide gas flow to a majority of the area defined by the upper wand plate 150. A number of sweep jets 182 extend from both the wand gas channel 174, and the transverse gas passages 180 to the lower surface of the lower wand plate 152. In addition, a central gas outlet jet 184 extends between the channel 174 and the lower surface of the lower wand plate 152. The central outlet jet 184 and sweep jets 182 provide the aforementioned Bernoulli flow for lifting wafers.

The flow of lifting gas proceeds from the proximal end of the arm portion 142 through the longitudinal gas passage 162 as indicted by the flow arrow 186 until it reaches the transfer conduit 176 where the gas transitions into the wand 144. The gas flows downward through the conduit 176 into the longitudinal gas channel 174 between the upper and lower wand plates 150, 152 and continues into the transverse gas passages 180. The gas is distributed at a uniform pressure throughout the wand 144 and exits from the underside thereof to provide a uniform and efficient lifting velocity. Specifically, some of the sweep jets 182 are angled proximally to provide flow such as indicated at 187, while other of the sweep jets are angled distally as indicated by the flow arrow 188. Preferably, the number of sweep jets 182 angled proximally outnumber the number angled distally, to induce a slight force on the levitated wafer in the proximal direction against the stop element 158. Alternatively, larger proximally angled sweep jets may be provided to accomplish the same result. The central gas outlet jet 184 extends perpendicularly to the underside of the wand 144 and sweeps out particulates which might otherwise flow into the reduced pressure region directly under the wand. The advantageous combination of sweep jets is the subject of U.S. Pat. No. 5,080,549 to Goodwin, et al., expressly incorporated by reference herewith.

Figure 11:
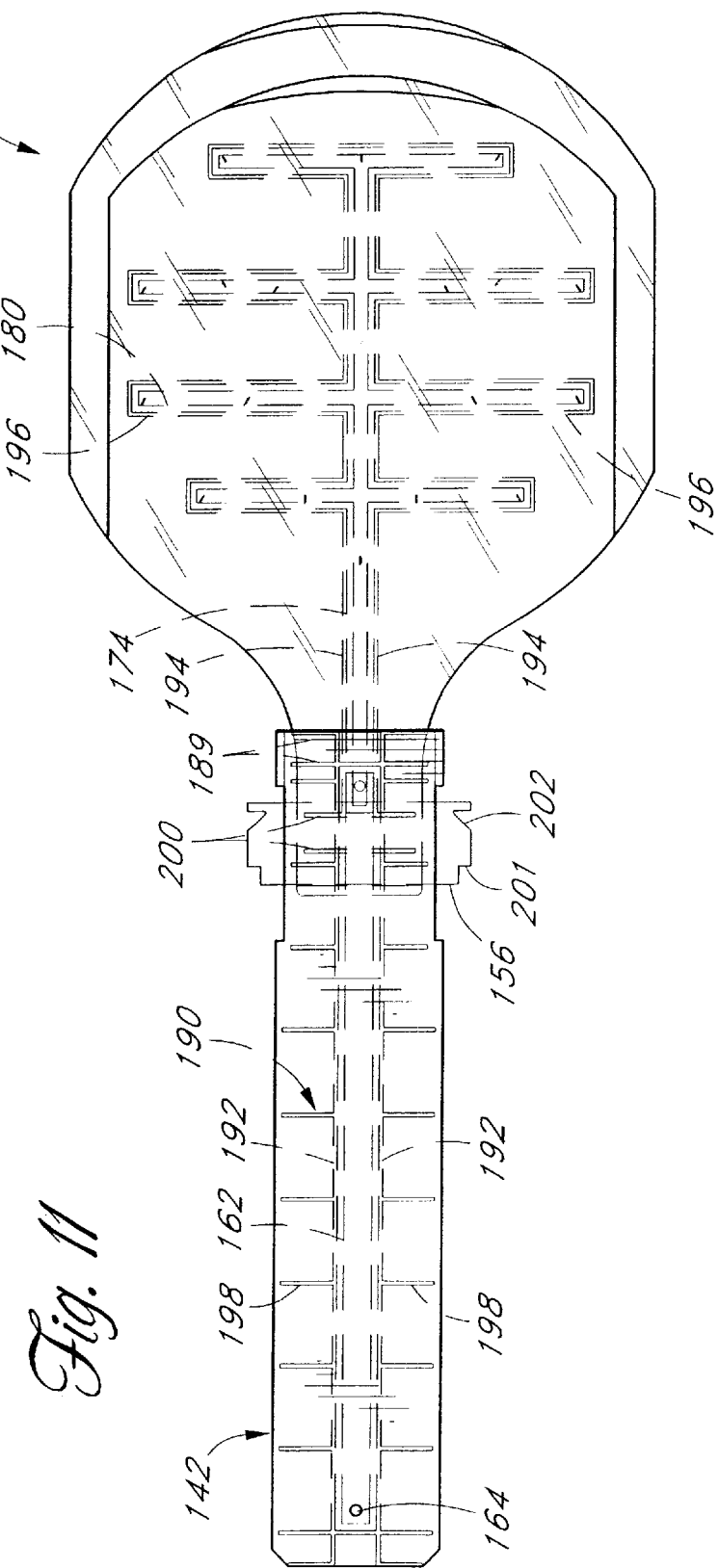
FIG. 11 is a top plan view of the Bernoulli wand showing internal fuse lines between adjacent quartz plates.
Figure 12:
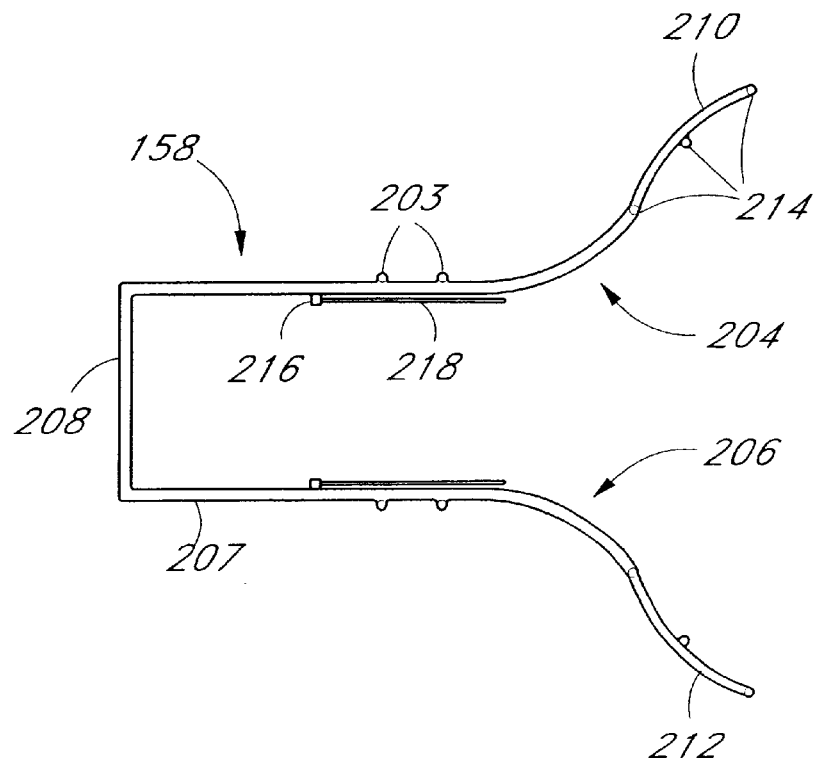
FIG. 12 is a top plan view of a quartz wafer stop element for use with the Bernoulli wand.
Figure 13:
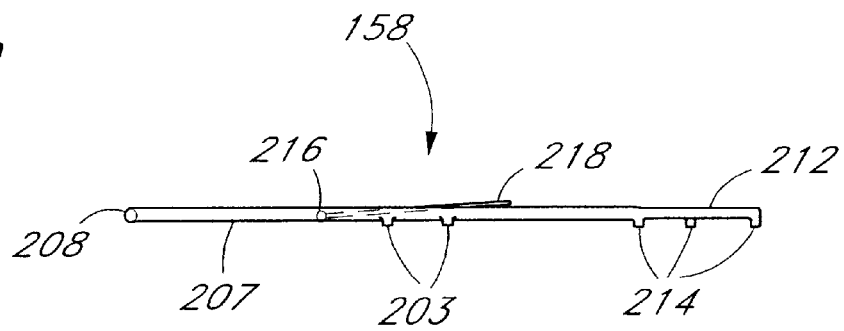
FIG. 13 is a side elevational view of the quartz wafer stop element.

FIG. 11 illustrates a particular pattern of fuse lines 190 for firmly joining the plates of both the arm portion 142, and the wand 144. The fuse lines are preferably formed by a process involving melting small glass beads or particles forming solid bonds between the juxtaposed plates. A mixture of ground glass in an organic lacquer carrier is applied to one of the facing plates by silk screen or other technique. For example, a mixture of glass particles and an epoxy may be applied to the lower of the two respective plates along the fuse lines indicated in FIG. 11 and the plates held together in an oven. The oven is then heated to a temperature of between 200–300EC to allow the organic epoxy to evaporate. Subsequently, the oven is ramped up to about 1000EC, or just below the melting temperature of quartz, to allow the smaller quartz particles between the juxtaposed plates to melt, thus fusing the two quartz plates together.

A pair of longitudinal fuse lines 192 extends from a proximal end of the arm portion 142 between the top arm plate 146 and bottom arm plate 148 on both sides of the arm gas passage 162. For strength, the arm portion 142 also includes a plurality of perpendicular fuse lines 198 at intermittent locations along its length. Likewise, a second pair of fuse lines 194 extends between the upper and lower wand plates 150, 152 longitudinally on both sides of the wand gas channel 144. The fuse lines 194 are interrupted at perpendicular sections 196 which extend around each of the transverse gas passages 180. The assembly of fuse line segments 194 and 196 define a single continuous unbroken fuse line surrounding the gas channels within the Bernoulli wand 144. The arm portion 142 and wand 144 are firmly held together by fuse lines such as shown at 189 so as to seal the area around the transfer conduit 176.

With reference to FIGS. 7, 10 and 12–13, the pickup arm 140 further includes the support plate 156 firmly attached underneath the neck portion 170 of the wand 144. The support plate 156 is fused to the underside of the neck portion 170 at a pair of fuse lines 200, seen in FIG. 11. The support plate 156 extends outward on either side of the arm portion 142 and terminates in a pair of irregular grooves 201, 202 (FIG. 11) for receiving pegs 203 on the wafer stop element 158. The illustrated wafer stop element 158 comprises an elongated, preferably tubular, piece of quartz having the pegs 203 extending vertically downward on both sides. As seen best in FIGS. 12 and 13, the wafer stop element 158 comprises bifurcated left and right feet 204 and 206 joined at a bridge 208. The left and right feet 204, 206, comprise straight, proximal portions 207 which are generally perpendicular to the bridge 208 and extend distally toward left and right wafer stop fingers 210 and 212, respectively. The wafer stop fingers 210 and 212 are curved to conform to the shape of the wafer being lifted by the Bernoulli wand 144, and have a plurality of stop pegs 214. Preferably, there are three such stop pegs 214 distributed along the arc of each finger. The wafer stop element 158 further includes a pair of bases 216 extending inwardly from the proximal portion of each foot, the bases forming mounts for thin retainer rods 218. The retainer rods are adapted to retain the wafer stop element 158 on the pickup arm 140 as will be described below.

The wafer stop element 158 is normally positioned as seen in FIG. 10 so that the six wafer stop pegs 214 are arrayed around a proximal end of the head portion 172 of the Bernoulli wand 144. The wafers picked up underneath the head portion 172 are biased in a proximal direction by the plurality of sweep jets 182, and the periphery of the wafer eventually contacts two or more of the stop pegs 214. Preferably the stop pegs 214 are positioned around a circle having the same diameter as the wafer and all contact the wafer at the same time. The wafer stop element 158 is designed to have some spring or resiliency so that when the wafer contacts the stop pegs 214, the left and right feet 204 and 206 spread apart slightly. This is enhanced by the outwardly directed arcuate fingers 210 and 212. Eventually, after repeated use, the pegs 214 may begin to wear out, as grooves may form therein from repeated contact with wafers. At this stage, the wafer stop element 158 is simply replaced by the procedure illustrated in FIGS. 14a–c.

FIG. 14a shows the wafer stop element 158 in a position prior to installation over the arm portion 142. The pickup wand 144 is partially shown in FIGS. 14a–c for clarity. The bridge 208 is positioned below the arm portion 142, and the left and right feet 204 and 206 are angled above the arm portion. As shown by the arrow 220, the wafer stop element 158 is pivoted in a clockwise direction until the thin retainer rods 218 contact a distal corner 222 formed by the rectangular cut-outs 160 in the arm portion top plate 146 (FIG. 14b). As seen from above in FIG. 7, the retainer rods 218 are positioned to interfere with the distal corners 222 of the cut-outs 160. At this point, the retainer rods 218 must be manually spread outward to allow them to travel past the distal corners 222 of the cut-outs 160, and then spring back inward as seen in FIG. 14c. At this stage, the pegs 203 fit within the grooves 201, 202 and the stop element is supported from below by the support plate 156.

As installed, the thin retainer rods 218 prevent upward motion of the left and right feet 204 and 206, and the retaining pegs 203 prevent either of the feet from inward motion. The design of the grooves 201, 202 is such that the feet 204, 206 are not restricted from outward motion. That is, upon wafer contact with the stop pegs 214, the feet 204 and 206 are subjected to a proximal force as well as a spreading force by virtue of the shape of the fingers 210 and 212. The proximal groove 201 presents no resistance to proximal movement of the pegs 203, but the distal groove includes an angled surface which resists without preventing proximal peg movement. Thus, the feet 204 and 206 may spread slightly as the entire stop element 158 shifts temporarily in the proximal direction. Subsequently, the feet 204 and 206 spring back to their original positions.

As mentioned above, the present wafer hand-off assembly 20 is preferably used in single processing chamber environments to take full advantage of its thin, linear profile. In other environments, such as cluster systems, the rotational capability of the drive mechanism may be utilized. Cluster systems typically include a handling chamber in which the wafer handling robot is located surrounded by a plurality of processing chamber for parallel or sequential wafer processing. The present invention may be used to speed up processing within such cluster systems by its ability to rapidly access and place wafers in load lock magazines with the paddle, while servicing hot processing chambers with the Bernoulli wand. In addition, the ability to hand-off wafers from paddle to wand and visa versa provides previously unavailable flexibility in programming the movements of the robot.

Although this invention has been described in terms of certain preferred embodiments, other embodiments that will be apparent to those of ordinary skill in the art are intended to be within the scope of this invention. Accordingly, the scope of the invention is intended to be defined by the claims that follow.

What is claimed is:

1. A Bernoulli wand for moving a semiconductor wafer into and out of a high temperature wafer processing environment, the wand comprising:

an elongated quartz arm to be supported on a proximal end by a device for moving the arm;

a quartz pickup head mounted to a distal end of the arm and having a plurality of gas outlets through a lower wall from which gas may be expelled to create a reduced pressure region above a wafer and lift the wafer without contact with the head; and a resilient elongated quartz wafer stop removably mounted on the pickup arm and including a pair of spaced portions spaced from but adjacent to a proximal end of the head to limit the proximal movement of a wafer lifted by the head.

2. The apparatus of claim 1, wherein the pickup head is wider than the arm and the wafer stop is removably mounted to a distal end of the arm and comprises a rod having bifurcated feet with distal ends extending outward from the arm adjacent the head and having the wafer-limiting portions.

3. The apparatus of claim 2, wherein the wafer-limiting portions are pegs provided on the distal ends.

4. The apparatus of claim 1, wherein the arm is formed by a pair of elongated quartz plates bonded together and forming between them a gas passage connected to the pickup head.

5. A Bernoulli wand for moving a semiconductor wafer into and out of a high temperature wafer processing environment, the wand comprising:

an elongated quartz arm to be supported on a proximal end by a device for moving the arm;

a quartz pickup head mounted to a distal end of the arm and having a plurality of gas outlets through a lower wall from which gas may be expelled to create a reduced pressure region above a wafer and lift the wafer without contact with the head; and a quartz wafer stop removably mounted on the pickup arm and including portions adjacent a proximal end of the head to limit the proximal movement of a wafer lifted by the head, wherein the pickup head is wider than the arm and the wafer stop is removably mounted to a distal end of the arm and comprises a rod having bifurcated feet with distal ends extending outward from the arm adjacent the head and having the wafer-limiting portions, and wherein the rod includes a bridge joining the bifurcated feet and sized longer than said arm is wide, the feet extending distally from said bridge generally parallel and to either side of the arm, each foot including a resilient quartz mounting element to retain the stop on the arm without fasteners or solid bonds.

6. The apparatus of claim 5, wherein the quartz mounting elements comprise thin rods extending from the feet to cooperate with the arm and retain the stop thereon.

7. A Bernoulli wand for moving a semiconductor wafer into and out of a high temperature wafer processing environment, the wand comprising:

an elongated quartz arm to be supported on a proximal end by a device for moving the arm;

a quartz pickup head mounted to a distal end of the arm and having a plurality of gas outlets through a lower wall from which gas may be expelled to create a reduced pressure region above a wafer and lift the wafer without contact with the head; and a quartz wafer stop removably mounted on the pickup arm and including portions adjacent a proximal end of the head to limit the proximal movement of a wafer lifted by the head, wherein the pickup head is wider than the arm and the wafer stop is removably mounted to a distal end of the arm and comprises a rod having bifurcated feet with distal ends extending outward from the arm adjacent the head and having wafer limiting portions, and wherein the bifurcated feet have a rod diameter enabling resilient outward movement of the feet upon contact between the wafer and wafer-limiting portions on the distal ends to allow for some cushioning of the impact between the wafer and wafer-limiting portions.

8. The apparatus of claim 7, wherein the feet include at least one peg and the arm includes cooperating laterally opening grooves to prevent relative distal movement but only resist relative proximal movement of the stop with respect to the arm, to enhance the cushioning of the impact between wafer and wafer-limiting portions.

9. A Bernoulli wand for moving a semiconductor wafer into and out of a high temperature environment, the wand comprising:

an elongated quartz arm to be supported on a proximal end by a device for moving the arm;

a quartz pickup head mounted to a distal end of the arm and having a plurality of gas outlets through a lower wall from which gas may be expelled to create a reduced pressure region above a wafer and lift the wafer without contact with the head; and a resilient quartz wafer stop removably attached on a distal end of the arm, said wafer stop comprising a single rod forming bifurcated feet connected by a substantially perpendicular bridge, said attachment effected by locating vertical restraints on proximal and distal sides of a fulcrum, the fulcrum comprising a mounting plate positioned beneath the wafer stop and mounted to the arm, the proximal vertical stop comprising the bridge, and the distal vertical stop comprising resilient mounting members attached to, and extending parallel to, each bifurcated foot.

10. The apparatus of claim 9, wherein the distal end of said bifurcated feet substantially conform to the perimeter shape of the wafer to be held by the wand.

11. The apparatus of claim 10, further comprising wafer-limiting portions formed on distal ends of the bifurcated feet of said wafer stop for contacting and inhibiting further proximal movement of the wafer.

12. The apparatus of claim 11, wherein the wafer stop has a cross-sectional diameter that allows it to be resilient in reaction to the force caused by a contacting wafer.

13. The apparatus of claim 12, wherein the bifurcated feet spread outwardly to cushion the impact of a wafer against them.

14. A device to be mounted on a Bernoulli wand to prevent rearward movement of a thin flat substrate, said device comprising:

an elongated element having a pair of spaced, generally straight side portions configured to extend along the edges of an elongated arm of a Bernoulli wand to be supported on a rear end by a robot for moving the arm, said side portions having rear ends being connected by a bridge that extends across said arm; and a pair of spaced fingers connected to forward ends of said side portions, said fingers being configured to substantially conform to a portion of the perimeter of the substrate to be held by a pick up head of the wand mounted to the forward end of the elongated arm, each of said fingers including a plurality of dependent pegs to be engaged by said substrate to limit rearward movement of the substrate, said element being somewhat resilient so that said spaced fingers can flex outwardly slightly when the substrate is moved rearwardly against the pegs so as to gently engage the substrate and prevent damage to it.

15. The device of claim 14, wherein said spaced side portions each includes a thin retainer rod secured in a manner to permit a free end of each rod to flex into a position locking the side portions to the wand arm.

* * * * *